United States Patent
Hayashi et al.

[11] Patent Number: 6,132,930
[45] Date of Patent: Oct. 17, 2000

[54] NEGATIVE PHOTORESIST COMPOSITION

[75] Inventors: Shunichi Hayashi; Kazumi Higashi, both of Osaka, Japan

[73] Assignee: Nitto Denko Corporation, Osaka, Japan

[21] Appl. No.: 09/409,693

[22] Filed: Sep. 30, 1999

[30] Foreign Application Priority Data

Oct. 1, 1998 [JP] Japan ................... 10-279513

[51] Int. Cl.[7] .................................... G03F 7/004
[52] U.S. Cl. .............. 430/270.1; 430/906; 430/920; 430/926
[58] Field of Search ............... 430/282.1, 906, 430/920, 926, 270.1

[56] References Cited

U.S. PATENT DOCUMENTS

| | | | |
|---|---|---|---|
| 5,081,000 | 1/1992 | Kuehn et al. | 430/281.1 |
| 5,665,523 | 9/1997 | Omote et al. | 430/282.1 |
| 5,858,518 | 1/1999 | Omote et al. | 428/209 |
| 5,861,235 | 1/1999 | Harkness et al. | 430/325 |

FOREIGN PATENT DOCUMENTS

| | | |
|---|---|---|
| 0 388 482 A1 | 9/1990 | European Pat. Off. . |
| 0 578 177 A2 | 1/1994 | European Pat. Off. . |
| 0 675 409 A1 | 10/1995 | European Pat. Off. . |
| WO 98/04959 | 2/1998 | European Pat. Off. . |
| 10-39510 | 2/1998 | Japan ............... G03F 7/038 |

*Primary Examiner*—Janet Baxter
*Assistant Examiner*—Rosemary Ashton
*Attorney, Agent, or Firm*—Sughrue, Mion, Zinn, Macpeak & Seas, PLLC

[57] ABSTRACT

A negative photoresist composition is disclosed which is excellent in sensitivity and resolution, tenaciously adheres to substrates, and can be advantageously used in practical production processes. Two 1,4-dihydropyridine derivatives each having a specific structure are incorporated as photosensitizers into a polyamic acid to obtain the negative photoresist composition.

5 Claims, No Drawings

NEGATIVE PHOTORESIST COMPOSITION

FIELD OF THE INVENTION

The present invention relates to a negative photoresist composition. More particularly, this invention relates to a negative photoresist composition comprising a photosensitive polyamic acid.

BACKGROUND OF THE INVENTION

Photoresist compositions comprising either a photosensitive polyimide or a polyamic acid as a precursor therefor have conventionally been used. These compositions in practical use are mostly of the negative type used in the following manner. The composition is applied to a substrate, and the coating is irradiated with actinic rays through a given photomask to thereby reduce the solubility of the exposed areas in a developing solution. The unexposed areas are then removed by dissolving the same in the developing solution to thereby form the desired negative pattern on the substrate.

These photoresist compositions comprising a photosensitive polyimide or a precursor therefor, which after irradiation with actinic rays leave the exposed areas on the substrate, have an advantage that the pattern obtained has excellent heat resistance. Because of this and other advantages, various proposals thereon have been made so far. Examples thereof include a technique of incorporating methacryloyl groups into a polyimide precursor through ester bonds or ionic bonds (see, for example, JP-A-49-11541 (the term "JP-A" as used herein means an "unexamined published Japanese patent application"), JP-A-50-40922, JP-A-54-145794, and JP-A-59-38038) and a self-sensitizing polyimide having a benzophenone skeleton and having alkyl groups in the nitrogen-bonded ortho positions (see, for example, JP-A-59-219330 and JP-A-59-231533).

However, such conventional negative photoresist compositions comprising a photosensitive polyimide or precursor therefor have problems, for example, that the photoresist film swells during development and that the unexposed areas of the photoresist film partly remain undissolved due to light diffraction during exposure through a photomask. The conventional photoresist compositions have another problem that the photoresist film has a degree of shrinkage as high as about 50% at heat curing and the pattern obtained has insufficient dimensional stability. Furthermore, the conventional compositions necessitate use of a developing solution containing an organic solvent and hence pose problems concerning working atmosphere, waste liquor treatment, etc.

Still a further problem of the latter photoresist composition described above is that since the polymer skeleton structure is limited, the properties of the film finally obtained are limited. Namely, the prior art composition failed to flexibly meet a variety of property requirements.

Under these circumstances, high-sensitivity negative photoresist compositions which can be obtained by incorporating as a photosensitizer a 1,4-dihydropyridine derivative capable of forming a salt having a pyridine skeleton upon irradiation with actinic rays into a polyamic acid as a polyimide precursor and are effective in eliminating the above-described various problems of conventional negative photoresist compositions comprising a photosensitive polyamic acid are proposed in JP-A-6-75376, JP-A-7-271034, and JP-A-10-39510.

However, these negative photoresist compositions still have problems that a developing solution penetrates into the interface between the photoresist film and the substrate during development to cause lifting at peripheral parts of the exposed areas, and that the polyimide film finally obtained through heat curing shows insufficient adhesion to the substrate.

SUMMARY OF THE INVENTION

The present invention has been achieved in order to eliminate the above-described problems of conventional negative photoresist compositions comprising a photosensitive polyamic acid. An object of the present invention is to provide a heat-resistant negative photoresist composition which contains a polyamic acid as a material for forming a heat-resistant resist, is relatively unrestricted in the structure of the polyamic acid, is excellent in sensitivity and resolution, tenaciously adheres to substrates, and can be advantageously used in practical production processes.

In particular, the present invention has been achieved in order to eliminate the above-described problems of the conventional negative photoresist composition comprising a polyamic acid and a 1,4-dihydropyridine derivative incorporated as a photosensitizer. Consequently, the object of the present invention more particularly is to provide a heat-resistant negative photoresist composition which comprises a photosensitive polyamic acid and which not only is excellent in both sensitivity and resolution but is easily developable with an aqueous alkali solution and has excellent adhesion to substrates.

The present invention provides a negative photoresist composition comprising a polyamic acid, a 1,4-dihydropyridine derivative represented by general formula (1):

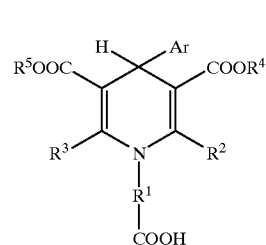

(1)

(wherein Ar represents an aromatic group having a nitro group in an ortho position, $R^1$ represents an alkylene group having 1 to 5 carbon atoms, and $R^2$, $R^3$, $R^4$, and $R^5$ each independently represents a hydrogen atom or an alkyl group having 1 to 4 carbon atoms), and a 1,4-dihydropyridine derivative represented by general formula (2):

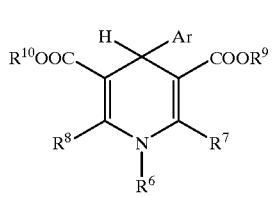

(2)

(wherein Ar represents an aromatic group having a nitro group in an ortho position, $R^6$ represents an alkyl group having 1 to 5 carbon atoms, and $R^7$, $R^8$, $R^9$, and $R^{10}$ each independently represents a hydrogen atom or an alkyl group having 1 to 4 carbon atoms).

Preferred among the 1,4-dihydropyridine derivatives represented by general formula (1) given above is 1-carboxyethyl-3,5-dimethoxycarbonyl-4-(2-nitrophenyl)-

1,4-dihydropyridine (represented by general formula (3) given below). Preferred among the 1,4-dihydropyridine derivatives represented by general formula (2) given above is 1-ethyl-3,5-dimethoxycarbonyl-4-(2-nitrophenyl)-1,4-dihydropyridine (represented by general formula (4) given below).

(3)

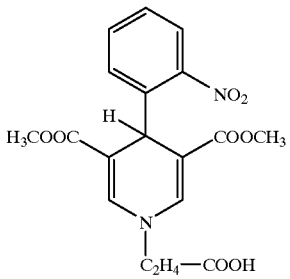

(4)

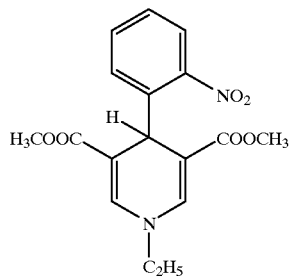

The polyamic acid is preferably one obtained by reacting a biphenyltetracarboxylic dianhydride with p-phenylenediamine and 4,4'-diaminodiphenyl ether.

DETAILED DESCRIPTION OF THE INVENTION

The negative photoresist composition of the present invention comprises a polyamic acid and two 1,4-dihydropyridine derivatives respectively represented by general formulae (1) and (2) given above. The polyamic acid is not particularly limited as long as it is a polyamic acid known to yield a polyimide upon heating. However, the polyamic acid generally has a structural unit represented by the following general formula (5):

(5)

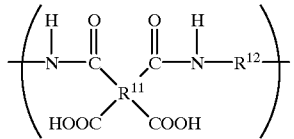

(wherein $R^{11}$ represents a tetravalent organic group and $R^{12}$ represents a bivalent organic group).

Examples of $R^{11}$, which is a tetravalent organic group, in the above structural unit include aromatic, aliphatic, or alicyclic tetravalent groups having the skeleton of, e.g., benzene, naphthalene, perylene, diphenyl, diphenyl ether, diphenyl sulfone, diphenylpropane, diphenylhexafluoropropane, benzophenone, butane, or cyclobutane. Especially preferred of these are tetravalent groups having the skeleton of benzene, diphenyl, diphenylhexafluoropropane, or benzophenone. However, $R^{11}$ should not be construed as being limited to these examples.

Examples of $R^{12}$, which is a bivalent organic group, in the above structural unit include aromatic, aliphatic, or alicyclic bivalent groups having the skeleton of, e.g., diphenyl ether, benzophenone, diphenylmethane, diphenylpropane, diphenylhexafluoropropane, diphenyl sulfoxide, diphenyl sulfone, diphenyl, benzene, or diphenoxybenzene. Especially preferred of these are bivalent groups having the skeleton of diphenyl ether, benzene, or diphenoxybenzene. However, $R^{12}$ should not be construed as being limited to these examples.

A polyamic acid having the structural unit described above can be obtained by reacting one or more tetracarboxylic dianhydrides having a tetravalent skeleton such as those shown above with one or more diamines having a bivalent skeleton such as those shown above in an almost equimolar proportion in an appropriate organic solvent such as N-methyl-2-pyrrolidone, dimethylacetamide, dimethylformamide, dimethyl sulfoxide, or hexamethylphosphoramide. The polyamic acid is especially preferably obtained by reacting a biphenyltetracarboxylic dianhydride as the tetracarboxylic dianhydride with p-phenylenediamine and 4,4'-diaminodiphenyl ether as the diamines.

In the negative photoresist composition of the present invention, a combination of a 1,4-dihydropyridine derivative represented by general formula (1) and a 1,4-dihydropyridine derivative represented by general formula (2) is used as a photosensitizer.

These 1,4-dihydropyridine derivatives respectively represented by general formulae (1) and (2) are incorporated in such amounts that the sum thereof is generally from 5 to 50 parts by weight, preferably from 10 to 30 parts by weight, per 100 parts by weight of the polyamic acid. If the incorporation amount of the 1,4-dihydropyridine derivatives is smaller than 5 parts by weight per 100 parts by weight of the polyamic acid, the photoresist composition obtained shows reduced developability after irradiation with actinic rays. Namely, the effect of reducing the solubility of exposed areas in an alkaline developing solution is insufficient and the pattern formed is apt to be indistinct. On the other hand, if the incorporation amount of the 1,4-dihydropyridine derivatives is larger than 50 parts by weight, a solid matter precipitates when the photoresist composition obtained is stored as a solution and this precipitation exerts adverse influences on storage stability and pattern-forming properties. Furthermore, there are cases where the negative pattern formed from such a composition undergoes a considerable weight decrease upon heat treatment, resulting in impaired mechanical strength.

The proportion of the 1,4-dihydropyridine derivative represented by general formula (1) to the 1,4-dihydropyridine derivative represented by general formula (2) is preferably from 1:5 to 5:1 by weight, more preferably from 1:3 to 3:1 by weight. If the proportion of the derivative represented by general formula (1) is smaller than the lower limit thereof, developability is impaired. If the proportion of the derivative represented by general formula (2) is smaller than the lower limit thereof, adhesion to substrates is impaired.

In the 1,4-dihydropyridine derivative represented by general formula (1), Ar represents an aromatic group having a nitro group in an ortho position, and is preferably an o-nitrophenyl group. $R^1$ represents an alkylene group having 1 to 5 carbon atoms, and is preferably a methylene, ethylene, or propylene group. $R^2$, $R^3$, $R^4$, and $R^5$ each represents a hydrogen atom or an alkyl group having 1 to 4 carbon atoms, and is preferably a hydrogen atom or a methyl or ethyl group. $R^2$ and $R^3$ each is more preferably a hydrogen atom.

Preferred examples of the 1,4-dihydropyridine derivative represented by general formula (1) for use in the present invention therefore include 1-carboxyethyl-3,5-dimethoxycarbonyl-4-(2-nitrophenyl)-1,4-dihydropyridine, 1-carboxymethyl-3,5-dimethoxycarbonyl-4-(2-nitrophenyl)-1,4-dihydropyridine, 1-carboxypropyl-3,5-dimethoxycarbonyl-4-(2-nitrophenyl)-1,4-dihydropyridine, and 1-carboxypropyl-3,5-diethoxycarbonyl-4-(2-nitrophenyl)-1,4-dihydropyridine. Especially preferred of these is 1-carboxyethyl-3,5-dimethoxycarbonyl-4-(2-nitrophenyl)-1,4-dihydropyridine, which is represented by the following general formula (3).

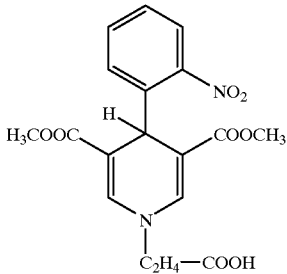

(3)

In the 1,4-dihydropyridine derivative represented by general formula (2), Ar represents an aromatic group having a nitro group in an ortho position, and is preferably an o-nitrophenyl group. $R^6$ represents an alkyl group having 1 to 4 carbon atoms, and is preferably a methyl, ethyl, or propyl group. $R^7$, $R^8$, $R^9$, and $R^{10}$ each independently represents a hydrogen atom or an alkyl group having 1 to 4 carbon atoms, and is preferably a hydrogen atom or a methyl or ethyl group. $R^7$ and $R^8$ each is more preferably a hydrogen atom.

Preferred examples of the 1,4 -dihydropyridine derivative represented by general formula (2) for use in the present invention therefore include 1-ethyl-3,5-dimethoxycarbonyl-4-(2-nitrophenyl)-1,4-dihydropyridine, 1-methyl-3,5-dimethoxycarbonyl-4-(2-nitrophenyl)-1,4-dihydropyridine, 1-propyl-3,5-dimethoxycarbonyl-4-(2-nitrophenyl)-1,4-dihydropyridine, and 1-propyl-3,5-diethoxycarbonyl-4-(2-nitrophenyl)-1,4-dihydropyridine. Especially preferred of these is 1-ethyl-3,5-dimethoxycarbonyl-4-(2-nitrophenyl)-1,4-dihydropyridine, which is represented by the following general formula (4).

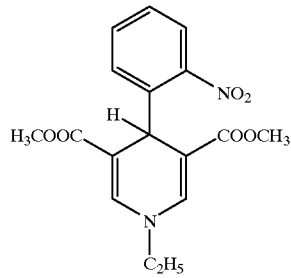

(4)

Such a 1,4-dihydropyridine derivative can be obtained, for example, by reacting a substituted benzaldehyde with an alkyl propiolate (alkyl ester of propargylic acid), which is used in an amount two times by mole the amount of the substituted benzaldehyde, and with the corresponding primary amine in glacial acetic acid with refluxing (see *Khim. Geterotsikl. Soed.*, pp.1067–1071, 1982).

The photoresist composition of the present invention is applied to an appropriate substrate, and the coating is dried, subsequently irradiated with actinic rays to conduct exposure, and then heated (post-exposure heating) to form a negative latent image. This coating film is developed to obtain a negative image, i.e., a desired pattern. Thereafter, this patterned film is finally heated to a high temperature to imidize the polyamic acid, whereby a pattern image consisting of a polyimide resin can be obtained. Ultraviolet rays are generally preferred as the actinic rays.

More specifically, the post-exposure heating may be conducted at a temperature of about 120° C. or higher although this temperature varies slightly depending on the kind of the photosensitizer used. As a result, the solubility of the exposed areas in a developing solution comprising an aqueous alkali solution is reduced and the unexposed areas accordingly come to have relatively high solubility in the developing solution. Thereafter, a negative image can be formed through development. The reason why the exposed areas come to have reduced solubility in an alkaline developing solution when the photoresist composition is exposed as described above may be as follows. The 1,4-dihydropyridine derivatives change into pyridine derivatives, quaternary ammonium hydroxide derivatives, etc. through intramolecular rearrangement. Through the subsequent heat treatment, these compounds undergo chemical reactions to have some interaction with the polyamic acid. As a result, the polyamic acid comes to have reduced alkali solubility to give a negative pattern.

According to the present invention, a dissolution accelerator for the unexposed areas of photoresist films can be incorporated into the photoresist composition. Examples of the dissolution accelerator include aromatic aldehydes such as nitrobenzaldehydes, dinitrobenzaldehydes, dianonebenzaldehydes, and isophthalaldehyde and high-boiling aliphatic aldehydes such as glyoxal. Especially preferred of these are o-, m-, and p-nitrobenzaldehydes. These dissolution accelerators may be used alone or as a mixture of two or more thereof. These dissolution accelerators are generally used in an amount of from 1.5 to 20 parts by weight per 100 parts by weight of the polyamic acid (on a solid basis). If the amount of a dissolution accelerator incorporated into the photoresist composition is too large, there are cases where the polyimide resin film obtained has impaired properties or where the photoresist film develops cracks after post-exposure heating or during development, subsequent drying, high-temperature heating, etc.

The negative photoresist composition of the present invention can be obtained, for example, by preparing a polyamic acid from one or more tetracarboxylic dianhydrides and one or more diamines in an appropriate organic solvent in the manner described hereinabove and mixing the resultant polyamic acid with the 1,4-dihydropyridine derivatives described above and, if desired, with the dissolution accelerator.

An example of methods for obtaining a negative pattern from the negative photoresist composition of the present invention is as follows. The photoresist composition of the present invention is applied on an appropriate substrate generally in a thickness of from 1 to 50 μm, preferably from 10 to 30 μm, on a dry basis. The coating is dried by heating at a temperature of from 50 to 100° C. and then irradiated with actinic rays through an appropriate photomask corresponding to the desired pattern. Thereafter, the exposed film is heated (post-exposure heating) at a temperature of from 120 to 200° C., preferably from 130 to 180° C., and then developed with a developing solution by the immersion method, spray method, etc. to remove the unexposed areas. Thus, a negative pattern can be obtained.

Examples of the developing solution used above include aqueous solutions of an inorganic alkali such as sodium hydroxide or potassium hydroxide. If desired and necessary, use may be made of an aqueous solution of an organic alkali such as propylamine, butylamine, monoethanolamine, tetramethylammonium hydroxide, or choline. These alkaline solutions may optionally contain an organic solvent, e.g., an alcohol, and various surfactants. By using such a developing solution, the unexposed areas of the photoresist film can be completely dissolved away within a practical period of time. After the photoresist film is thus exposed and developed, it is rinsed with water to thereby obtain a resin film having the desired negative pattern.

There are cases where the polyamic acid salt formed during development is less apt to diffuse or dissolve in the developing solution depending on the kind of the polyamic acid or the alkali concentration of the alkaline developing solution. However, the polyamic acid remaining after the development readily dissolves away during the subsequent rinsing with water, preferably with warm or hot water having a temperature of 40° C. or higher, whereby a pattern can be obtained.

Subsequently, the resin film is finally heated to a temperature of about from 300 to 500° C., upon which the polyamic acid is imidized through dehydrocyclization. Thus, a negative image consisting of a heat-resistant polyimide resin can be obtained.

Using the negative photoresist composition of the present invention, a circuit board can hence be obtained in the following manner. The photoresist composition is applied to an appropriate metal foil substrate made of, e.g., copper or aluminum, and the coating is dried, irradiated with actinic rays through a photomask, subsequently heated to a temperature of from 120 to 200° C., and then developed with an alkaline developing solution to dissolve away the unexposed areas. The negative pattern thus formed is heated to a temperature not lower than 300° C. to imidize the polyamic acid, whereby a circuit board having a polyimide resin film of the desired pattern as an insulating layer can be obtained. More specifically, an insulating layer made of a polyimide resin is formed on a metal foil substrate in the above-described manner and a given circuit pattern consisting of a conductor layer is then formed on the insulating layer. Thus, a circuit-bearing suspension board, for example, can be obtained.

Furthermore, the negative photoresist composition of the present invention can be used also in the following manner. A circuit board obtained by forming a patterned conductive layer (e.g., a copper foil) on an insulating layer (e.g., a polyimide film) is coated on the conductive-layer side with the negative photoresist composition, and a negative pattern is formed from the coating in the same manner as the above to thereby form an insulating layer having given openings so that the conductive layer is exposed in the openings. The openings are filled with a conductive material (e.g., a deposit of a metal such as copper or nickel) so that the conductive layer is electrically connected to the conductive material, whereby a circuit board for mounting on electronic parts can be produced. Specific examples of the above application of the negative photoresist composition of the present invention include use of the composition as a material for the insulating layer of an interposer to be mounted on a semiconductor.

EXAMPLES

The present invention will be explained below by reference to Examples and Reference Examples, but the invention should not be construed as being limited to these Examples in any way.

Reference Example 1

(Synthesis of 1-Carboxyethyl-3,5-dimethoxycarbonyl-4-(2-nitrophenyl)-1,4-dihydropyridine)

In 6 g of acetic acid were dissolved 7.56 g (0.05 mol) of o-nitrobenzaldehyde and 6.68 g (0.075 mol) of β-alanine. While this solution was kept being heated at 100° C. on an oil bath, 8.41 g (0.10 mol) of methyl propiolate was added dropwise thereto with stirring over 1 hour. After the addition, the resultant mixture was heated and stirred for further 30 minutes and then cooled to room temperature. Ten grams of methanol was mixed therewith, and the resultant mixture was cooled with a refrigerator. The crystals thus precipitated were taken out by filtration, washed with methanol, and then purified by recrystallization from ethanol to obtain 10 g of crystals of 1-carboxyethyl-3,5-dimethoxycarbonyl-4-(2-nitrophenyl)-1,4-dihydropyridine (yield, 50%).

Reference Example 2

(Synthesis of 1-Ethyl-3,5-dimethoxycarbonyl-4-(2-nitrophenyl)-1,4-dihydropyridine)

1-Ethyl-3,5-dimethoxycarbonyl-4-(2-nitrophenyl)-1,4-dihydropyridine was obtained from o-nitrobenzaldehyde, ethylamine, and methyl propiolate in the same manner as in Reference Example 1.

Reference Example 3

(Synthesis of 1-Carboxypropyl-3,5-diethoxycarbonyl-4-(2-nitrophenyl)-1,4-dihydropyridine)

1-Carboxypropyl-3,5-diethoxycarbonyl-4-(2-nitrophenyl)-1,4-dihydropyridine was obtained from o-nitrobenzaldehyde, γ-aminobutyric acid, and ethyl propiolate in the same manner as in Reference Example 1.

Reference Example 4

(Synthesis of 1-Propyl-3,5-dimethoxycarbonyl-4-(2-nitrophenyl)-1,4-dihydropyridine)

1-Propyl-3,5-dimethoxycarbonyl-4-(2-nitrophenyl)-1,4-dihydropyridine was obtained from o-nitrobenzaldehyde, n-propylamine, and methyl propiolate in the same manner as in Reference Example 1.

Example 1

A biphenyltetracarboxylic dianhydride and p-phenylenediamine in an almost equimolar proportion were dissolved in N-methyl-2-pyrrolidone in a total monomer concentration of 15% by weight. The monomers were reacted first at room temperature for 12 hours and then at 75° C. for 24 hours to obtain a solution of a polyamic acid.

To this solution were added 20 parts by weight of the 1-carboxyethyl-3,5-dimethoxycarbonyl-4-(2-nitrophenyl)-1,4-dihydropyridine obtained in Reference Example 1 and 10 parts by weight of the 1-ethyl-3,5-dimethoxycarbonyl-4-(2-nitrophenyl)-1,4-dihydropyridine obtained in Reference Example 2 (in a proportion of 2:1 by weight) per 100 parts by weight of the polyamic acid (on a solid basis). The dihydropyridine derivatives were evenly dissolved to obtain a solution of a photoresist composition.

This solution of a photoresist composition was applied to an SUS foil with a spin coater, and the coating was dried in a 90° C. oven for 15 minutes to obtain a coating film having a thickness of 15 μm. Thereafter, contact exposure was conducted for 15 seconds through a glass mask with a 250-W extra-high-pressure mercury lamp.

After the exposure, the coating film on the foil was heated in a 150° C. oven for 10 minutes, subsequently immersed in a 5 wt % aqueous solution of tetramethylammonium hydroxide (developing solution) at 40° C. for 2 minutes (the unexposed areas blushed and swelled upon this immersion), and then rinsed with 50° C. hot water. As a result, the unexposed areas dissolved away to give a satisfactory negative pattern consisting only of the exposed areas distinctly remaining on the SUS foil. The retention of film thickness after the development was 90%.

This pattern was heated in a nitrogen atmosphere at 380° C. for 2 hours to imidize the polyamic acid. The film after the imidization had a thickness of 10 μm, which was 70% of the film thickness prior to the imidization with heating. This film was subjected to a crosscut tape test. As a result, the film was not peeled off at all.

Example 2

A solution of a photoresist composition was obtained in the same manner as in Example 1, except that 15 parts by weight of the 1-carboxypropyl-3,5-diethoxycarbonyl-4-(2-nitrophenyl)-1,4-dihydropyridine obtained in Reference Example 3 and 15 parts by weight of the 1-propyl-3,5-dimethoxycarbonyl-4-(2-nitrophenyl)-1,4-dihydropyridine obtained in Reference Example 4 (in a proportion of 1:1 by weight) were used as a photosensitizer in combination with the same polyamic acid as in Example 1.

Using this solution of a photoresist composition, a satisfactory negative pattern was obtained on an SUS foil in the same manner as in Example 1. The retention of film thickness after development was 90%.

Thereafter, the polyamic acid was imidized in the same manner as in Example 1. The film after the imidization had a thickness of 10 μm, which was 70% of the film thickness prior to the imidization with heating. This film was subjected to a crosscut tape test. As a result, the film was not peeled off at all.

Example 3

Monomers consisting of a biphenyltetracarboxylic dianhydride, p-phenylenediamine, and 1,3-bis(γ-aminopropyl)-1,1,3,3-tetramethyldisiloxane in a proportion of 1:0.95:0.05 by mole were dissolved in N-methyl-2-pyrrolidone in a total monomer concentration of 18% by weight. The monomers were reacted first at room temperature for 12 hours and then at 75° C. for 24 hours to obtain a solution of a polyamic acid.

Using the polyamic acid solution, a solution of a photoresist composition was obtained in the same manner as in Example 1.

Subsequently, a satisfactory negative pattern was obtained on an SUS foil in the same manner as in Example 1, except that the period of immersion in the developing solution was changed to 3 minutes. The retention of film thickness after development was 90%.

Thereafter, the polyamic acid was imidized in the same manner as in Example 1. The film after the imidization had a thickness of 10 μm, which was 70% of the film thickness prior to the imidization with heating. This film was subjected to a crosscut tape test. As a result, the film was not peeled off at all.

Example 4

Monomers consisting of a biphenyltetracarboxylic dianhydride, 2,2-bis(3,4-dicarboxyphenyl) hexafluoropropane dianhydride, and p-phenylenediamine in a proportion of 0.9:0.1:1 by mole were dissolved in N-methyl-2-pyrrolidone in a total monomer concentration of 15% by weight. The monomers were reacted first at room temperature for 12 hours and then at 75° C. for 24 hours to obtain a solution of a polyamic acid.

Using the polyamic acid solution, a solution of a photoresist composition was obtained in the same manner as in Example 1.

Subsequently, a satisfactory negative pattern was obtained on an SUS foil in the same manner as in Example 1, except that the period of immersion in the developing solution was changed to 5 minutes (the unexposed areas blushed and swelled upon this immersion). The retention of film thickness after development was 90%.

Thereafter, the polyamic acid was imidized in the same manner as in Example 1. The film after the imidization had a thickness of 10 μm, which was 70% of the film thickness prior to the imidization with heating. This film was subjected to a crosscut tape test. As a result, the film was not peeled off at all.

Example 5

Monomers consisting of a biphenyltetracarboxylic dianhydride, p-phenylenediamine, and 4,4'-diaminodiphenyl ether in a proportion of 1:0.85:0.15 by mole were dissolved in N-methyl-2-pyrrolidone in a total monomer concentration of 15% by weight. The monomers were reacted first at room temperature for 12 hours and then at 75° C. for 24 hours to obtain a solution of a polyamic acid.

To this solution were added 10 parts by weight of the 1-carboxyethyl-3,5-dimethoxycarbonyl-4-(2-nitrophenyl)-1,4-dihydropyridine obtained in Reference Example 1 and 10 parts by weight of the 1-ethyl-3,5-dimethoxycarbonyl-4-(2-nitrophenyl)-1,4-dihydropyridine obtained in Reference Example 2 (in a proportion of 1:1 by weight) per 100 parts by weight of the polyamic acid (on a solid basis). The dihydropyridine derivatives were evenly dissolved to obtain a solution of a photoresist composition.

This solution of a photoresist composition was applied to an SUS foil with a spin coater, and the coating was dried in a 90° C. oven for 15 minutes to obtain a coating film having a thickness of 15 μm. Thereafter, contact exposure was conducted for 15 seconds through a glass mask with a 250-W extra-high-pressure mercury lamp.

After the exposure, the coating film on the foil was heated in a 170° C. oven for 2 minutes, subsequently immersed in a 2 wt % aqueous solution of sodium hydroxide (developing solution) at 50° C. for 4 minutes (the unexposed areas blushed and swelled upon this immersion), and then rinsed with 50° C. hot water. As a result, the unexposed areas dissolved away to give a satisfactory negative pattern consisting only of the exposed areas distinctly remaining on the SUS foil. The retention of film thickness after the development was 85%.

The polyamic acid was imidized in the same manner as in Example 1. The film after the imidization had a thickness of 9 μm, which was 70% of the film thickness prior to the imidization with heating. This film was subjected to a crosscut tape test. As a result, the film was not peeled off at all.

Example 6

The solution of a photoresist composition obtained in Example 5 was applied on a copper circuit pattern formed on an insulating polyimide film. The coating was dried in a 90° C. oven for 15 minutes to obtain a coating film having a thickness of 15 μm. Thereafter, contact exposure was conducted for 15 seconds through a glass mask with a 250-W extra-high-pressure mercury lamp.

After the exposure, the coating film on the foil was heated in a 170° C. oven for 2 minutes, subsequently immersed in a 4 wt % aqueous solution of sodium hydroxide (developing solution) at 50° C. for 3 minutes (the unexposed areas blushed and swelled upon this immersion), and then rinsed with 60° C. hot water. As a result, the unexposed areas dissolved away to give a satisfactory negative pattern consisting only of the exposed areas distinctly remaining on the copper circuit pattern. The retention of film thickness after the development was 88%.

This negative pattern was heated in a nitrogen atmosphere at 350° C. for 1 hour to imidize the polyamic acid. Thus, a circuit board was obtained which had as an insulating layer the negative pattern made of a polyimide resin. The film after the imidization had a thickness of 7.5 μm, which was 70% of the film thickness prior to the imidization with heating. This film was subjected to a crosscut tape test. As a result, the film was not peeled off at all. Furthermore, the circuit board obtained above was immersed in a 265° C. solder bath for 1 minute. As a result, neither blistering nor peeling was observed.

Comparative Example 1

A solution of a photoresist composition was obtained in the same manner as in Example 1, except that the 1-carboxyethyl-3,5-dimethoxycarbonyl-4-(2-nitrophenyl)-1,4-dihydropyridine obtained in Reference Example 1 (30 parts by weight) was used alone as a photosensitizer in combination with the same polyamic acid as in Example 1.

Using this solution of a photoresist composition, a negative pattern was obtained on an SUS foil in the same manner as in Example 1, except that the exposure period was changed to 30 seconds. The retention of film thickness after development was 90%.

Thereafter, the polyamic acid was imidized in the same manner as in Example 1. The film after the imidization had a thickness of 10 μm, which was 70% of the film thickness prior to the imidization with heating. This film was subjected to a crosscut tape test. As a result, about a half of the polyimide film was peeled off the SUS substrate, showing that this polyimide film was clearly inferior to that obtained in Example 1 in adhesion to the substrate.

Comparative Example 2

A negative pattern was obtained on an SUS foil in the same manner as in Example 5, except that the use amounts of the 1-carboxyethyl-3,5-dimethoxycarbonyl-4-(2-nitrophenyl)-1,4-dihydropyridine obtained in Reference Example 1 and the 1-ethyl-3,5-dimethoxycarbonyl-4-(2-nitrophenyl)-1,4-dihydropyridine obtained in Reference Example 2 were changed to 24 parts by weight and 4 parts by weight, respectively (the two compounds were used in a proportion of 6:1 by weight). The retention of film thickness after development was 85%.

Thereafter, this pattern was imidized in the same manner as in Example 1. The film after the imidization had a thickness of 9 μm, which was 70% of the film thickness prior to the imidization with heating. This film was subjected to a crosscut tape test. As a result, about a half of the polyimide film was peeled off the SUS substrate, showing that this polyimide film was clearly inferior to that obtained in Example 5 in adhesion to the substrate.

The photoresist composition of the present invention has high sensitivity and is capable of forming a negative pattern having a high resolution. For the composition, an aqueous alkali solution can be used as a developing solution. Furthermore, the negative polyimide resin pattern finally obtained from the photoresist composition of the present invention is excellent in electrical properties, mechanical properties, and adhesion, not to mention heat resistance. The photoresist composition can therefore be advantageously used as a material for forming insulating layers in circuit boards to be mounted on electronic parts.

While the invention has been described in detail and with reference to specific embodiments thereof, it will be apparent to one skilled in the art that various changes and modifications can be made therein without departing from the spirit and scope thereof.

What is claimed is:

1. A negative photoresist composition comprising a polyamic acid, a 1,4-dihydropyridine derivative represented by formula (1):

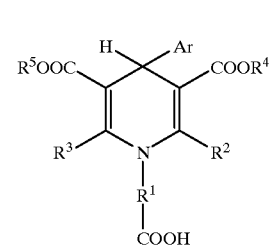

(1)

wherein Ar represents an aromatic group having a nitro group in an ortho position, $R^1$ represents an alkylene group having 1 to 5 carbon atoms, and $R^2$, $R^3$, $R^4$, and $R^5$ each independently represents a hydrogen atom or an alkyl group having 1 to 4 carbon atoms, and a 1,4-dihydropyridine derivative represented by formula (2):

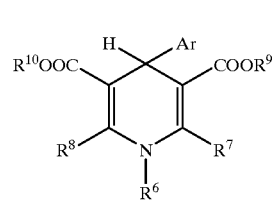

(2)

wherein Ar represents an aromatic group having a nitro group in an ortho position, $R^6$ represents an alkyl group having 1 to 5 carbon atoms, and $R^7$, $R^8$, $R^9$, and $R^{10}$ each independently represents a hydrogen atom or an alkyl group having 1 to 4 carbon atoms.

2. The negative photoresist composition of claim 1, wherein the proportion of the 1,4-dihydropyridine derivative represented by formula (1) to the 1,4-dihydropyridine derivative represented by formula (2) is from 1:5 to 5:1 by weight.

3. A negative photoresist composition comprising a polyamic acid, 1-carboxyethyl-3,5-dimethoxycarbonyl-4-(2-nitrophenyl)-1,4-dihydropyridine, represented by formula (3):

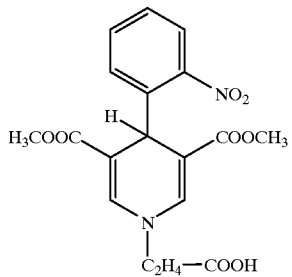

(3)

and 1-ethyl-3,5-dimethoxycarbonyl-4-(2-nitrophenyl)-1,4-dihydropyridine, represented by formula (4):

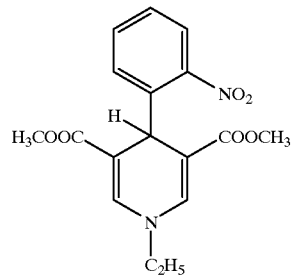

(4)

4. The negative photoresist composition of claim 3, wherein the proportion of the 1-carboxyethyl-3,5-dimethoxycarbonyl-4-(2-nitrophenyl)-1,4-dihydropyridine, represented by formula (3), to the 1-ethyl-3,5-dimethoxycarbonyl-4-(2-nitrophenyl)-1,4-dihydropyridine, represented by formula (4), is from 1:5 to 5:1 by weight.

5. The negative photoresist composition of claim 1, wherein the polyamic acid is one obtained by reacting a biphenyltetracarboxylic dianhydride with p-phenylenediamine and 4,4'-diaminodiphenyl ether.

* * * * *